(12) United States Patent
Fachmann et al.

(10) Patent No.: US 12,273,098 B2
(45) Date of Patent: Apr. 8, 2025

(54) METHOD FOR OPERATING A POWER TRANSISTOR CIRCUIT

(71) Applicant: Infineon Technologies Austria AG, Villach (AT)

(72) Inventors: Christian Fachmann, Villach (AT); Matteo-Alessandro Kutschak, Ludmannsdorf (AT); Otto Wiedenbauer, Villach (AT); Winfried Kaindl, Unterhaching (DE); Hans Weber, Villach (AT)

(73) Assignee: Infineon Technologies Austria AG, Villach (AT)

( * ) Notice: Subject to any disclaimer, the term of this patent is extended or adjusted under 35 U.S.C. 154(b) by 71 days.

(21) Appl. No.: 18/130,502

(22) Filed: Apr. 4, 2023

(65) Prior Publication Data

US 2023/0344422 A1 Oct. 26, 2023

(30) Foreign Application Priority Data

Apr. 21, 2022 (EP) .................................. 22169317

(51) Int. Cl.
*H03K 17/0812* (2006.01)
*H03K 17/284* (2006.01)

(52) U.S. Cl.
CPC ..... *H03K 17/08122* (2013.01); *H03K 17/284* (2013.01)

(58) Field of Classification Search
CPC ............................................... H03K 17/08122

USPC ........................................................ 327/427
See application file for complete search history.

(56) References Cited

U.S. PATENT DOCUMENTS

| 11,101,643 | B2 | 8/2021 | Handy et al. |
| 2019/0393871 | A1 | 12/2019 | Springett |
| 2021/0328436 | A1* | 10/2021 | Gao ........................ H02M 1/32 |

OTHER PUBLICATIONS

"Infineon—Some Key Facts about Avalanche", Version 1.0, Jan. 9, 2017, pp. 1-37.
Chen, Jingdong, et al., "Analysis of Avalanche Behaviour for Paralleled MOSFETs", SAE Technical Paper, Mar. 8, 2004.
Williams, Richard K., et al., "The Trench Power MOSFET—Part II: Application Specific VDMOS, LDMOS, Packaging, and Reliability", IEEE Transactions on Electron Devices, vol. 64, No. 3, Mar. 2017, pp. 692-712.

* cited by examiner

*Primary Examiner* — Tomi Skibinski
(74) *Attorney, Agent, or Firm* — Murphy, Bilak & Homiller, PLLC

(57) ABSTRACT

A method is disclosed. The method includes switching off a power transistor circuit in an electronic circuit. The electronic circuit includes a power source and a load circuit. The power transistor circuit is connected between the power source and the load circuit. Switching off the power transistor circuit includes operating at least one power transistor included in the power transistor circuit in an Avalanche mode so that at least a portion of energy stored in the electronic circuit before switching off the power transistor circuit is dissipated in the at least one power transistor.

18 Claims, 6 Drawing Sheets

METHOD FOR OPERATING A POWER TRANSISTOR CIRCUIT

TECHNICAL FIELD

This disclosure relates in general to a method for operating a power transistor circuit.

BACKGROUND

Power transistor circuits that include one or more power transistors are widely used as electronic switches in various kinds of electronic circuits. In electronic circuits that include (parasitic) inductances, switching off the power transistor circuit, that is, switching off the at least one power transistor in the power transistor circuit, may cause a voltage across the power transistor circuit to increase due to energy stored in the inductances.

A clamping circuit may be connected in parallel with the power transistor circuit. The clamping circuit is configured to clamp the voltage to a voltage level that is lower than a breakdown voltage of the at least one power transistor and dissipate the energy stored in the inductances. A clamping circuit, however, adds to the cost and complexity of the overall circuit.

SUMMARY

One example relates to a method. The method includes switching off a power transistor circuit in an electronic circuit. The electronic circuit includes a power source, a load circuit, and the power transistor circuit connected between the power source and the load circuit. Switching off the power transistor circuit includes operating at least one power transistor included in the power transistor circuit in an Avalanche mode so that at least a portion of energy stored in the electronic circuit before switching off the power transistor circuit is dissipated in the at least one power transistor.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
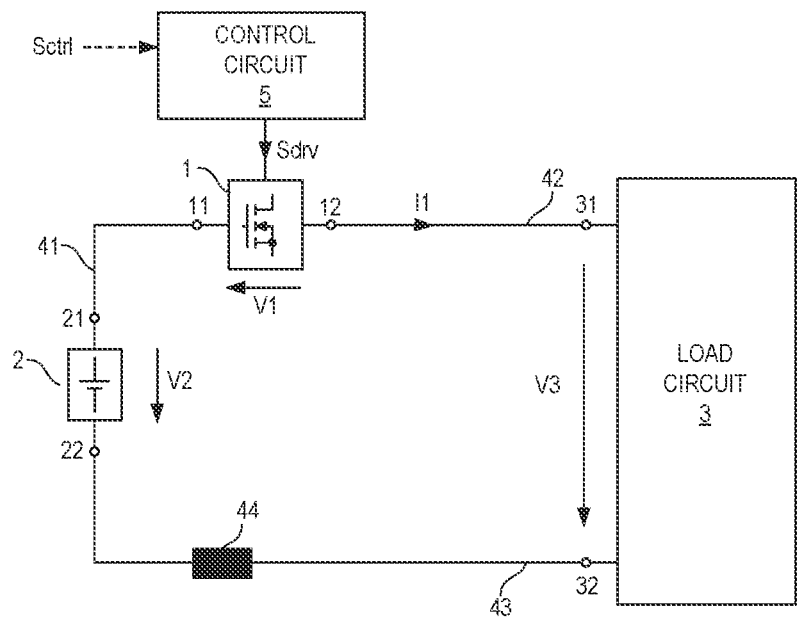
FIG. 1 illustrates a circuit diagram of an electronic circuit that includes a power source, a load circuit and a power transistor circuit connected between the power source and the load circuit.

FIG. 1 shows a circuit diagram of an electronic circuit according to one example. The electronic circuit includes a power source 2, a load circuit 3, and a power transistor circuit 1 connected between the power source 2 and the load circuit 3. The power source 2 is configured to provide a supply voltage V2.

According to one example, the supply voltage V2 is a DC (direct current) voltage and the power source 2 is a DC power source. A DC power source 2 can be implemented in various ways. Examples of the DC power source 2 include, but are not restricted to, a battery, a PV (photovoltaic) module, or a power converter configured to convert an alternating input voltage received from a power grid, for example, into the DC supply voltage V2.

According to another example, the power source 2 is an AC (alternating current) power source, so that the supply voltage V2 is an alternating voltage. The AC power source is a power grid, for example. According to an example, a frequency of the AC supply voltage V2 is less than 100 Hz.

A voltage level (when the supply voltage is a DC voltage) or an amplitude (when the supply voltage is an AC voltage) of the supply voltage V2 provided by the power source 2 is dependent on the requirements of the load circuit 3. According to one example, the voltage level or amplitude of the supply voltage V2 is selected from between 100V and 6000V, in particular between 400V and 2000V, for example.

According to one example, the power transistor circuit 1 connected between the power source 2 and the load circuit 3 acts as an electronic switch that is either operated in an on-state or an off-state. In the on-state, the power transistor circuit 1 connects the power source 2 to the load circuit 3, so that a load voltage V3 received between input nodes 31, 32 of the load circuit 3 essentially equals the voltage V2 provided by the power source 2 (a voltage V1 across the power transistor circuit 1 is negligible as compared to the supply voltage V2 and the load voltage V3). In the off-state, the power transistor circuit 1 interrupts a connection between the power source 2 and the load circuit 3, so that the load voltage V3 is zero and the voltage V1 across the power transistor circuit 1 essentially equals the supply voltage V2.

The load circuit 3 may include any kind of electrical load that can be driven by the supply voltage V2 provided by the power source 2. The load circuit 3 may include a single load such as, for example, a motor, or may include a network with a plurality of loads. According to one example, the load circuit 3 includes at least one power converter that, in the on-state of the power transistor circuit 1, receives the supply voltage V2 from the power source 2 and is configured generate a DC voltage or an AC (alternating current) voltage configured to drive a respective load. It should be noted that the load circuit 3 may include at least one electronic switch that is configured to switch on or off a respective load included in the load circuit 3. According to one example, the power transistor circuit 1 is only used to either connect the load circuit 3 to the power source or to disconnect the load circuit 3 from the power source 2. Thus, in the on-state of the power transistor circuit 1 a current level of a current I1 flowing from the power source 2 through the power transistor circuit 1 to the load circuit 3 is governed by the load circuit 3.

According to one example, the electronic circuit further includes a control circuit 5 that is configured to drive the power transistor circuit 1, wherein driving the power transistor circuit includes operating the power transistor circuit 1 in the on-state or the off-state. According to one example, the control circuit 5 is configured to generate a drive signal Sdrv that is received by the power transistor circuit 1. The drive signal Sdrv may have an on-level that switches on the power transistor circuit 1 or an off-level that switches off the power transistor circuit 1.

According to one example, the control circuit 5 includes circuitry that is configured to decide whether to switch on or off the power transistor circuit 1. According to another example, the control circuit 5 receives a control signal Sctrl, wherein the control signal Sctrl includes information whether to switch on or switch off the power transistor circuit 1. In this example, the control circuit 5 is configured to generate the drive signal Sdrv based on the control signal Sctrl.

Referring to FIG. 1, the electronic circuit may include inductors 41, 42, 43 for connecting the power source 2, the power transistor circuit 1, and the load circuit 3 with each other. According to one example, these inductors include a first inductor 41 connected between a first node 21 of the power source 2 and a first node 11 of the power transistor circuit 1, a second conductor 42 connected between a second node 12 of the power transistor circuit 1 and a first node 31 of the load circuit 3, and a third conductor 43 connected between a second node 22 of the power source 2 and a second node 37 of the load circuit 3. These conductors may include, for example, cables, conductor rails, or combinations thereof.

Inevitably, the conductors 41, 42, 43 connecting the power source 2, the power transistor circuit 1, and the load circuit 3 have parasitic inductances. These parasitic inductances are represented by inductor 44 in the electronic circuit according to FIG. 1. Inductor 44 in FIG. 1 represents any parasitic inductance in the electronic circuit in which energy is magnetically stored when the power transistor circuit 1 is in the on-state, wherein such energy is dissipated when the power transistor circuit 1 switches off. An overall parasitic inductance is lower than 20 mH (millihenries), lower than 5 mH, lower than 500 µH (microhenries), lower than 100 µH, or even lower than 10 µH, for example.

According to one example, in an electronic circuit in which the power source 2 is an AC power source, the maximum overall parasitic inductance is between 50 µH and 20 mH. In an electronic circuit, in which the power source 2 is a DC power source, the maximum overall parasitic inductance is between 0.5 µH and 20 µH, for example.

The power transistor circuit 1 includes at least one power transistor. This is explained with reference to examples in detail herein further below. In the electronic circuit according to FIG. 1, switching off the power transistor circuit 1 includes operating the at least one power transistor in an Avalanche mode, so that at least a portion of the energy stored in the parasitic inductances of the electronic circuit is dissipated in the at least one power transistor. This is explained with reference to FIG. 2 in the following.

Figure 2:
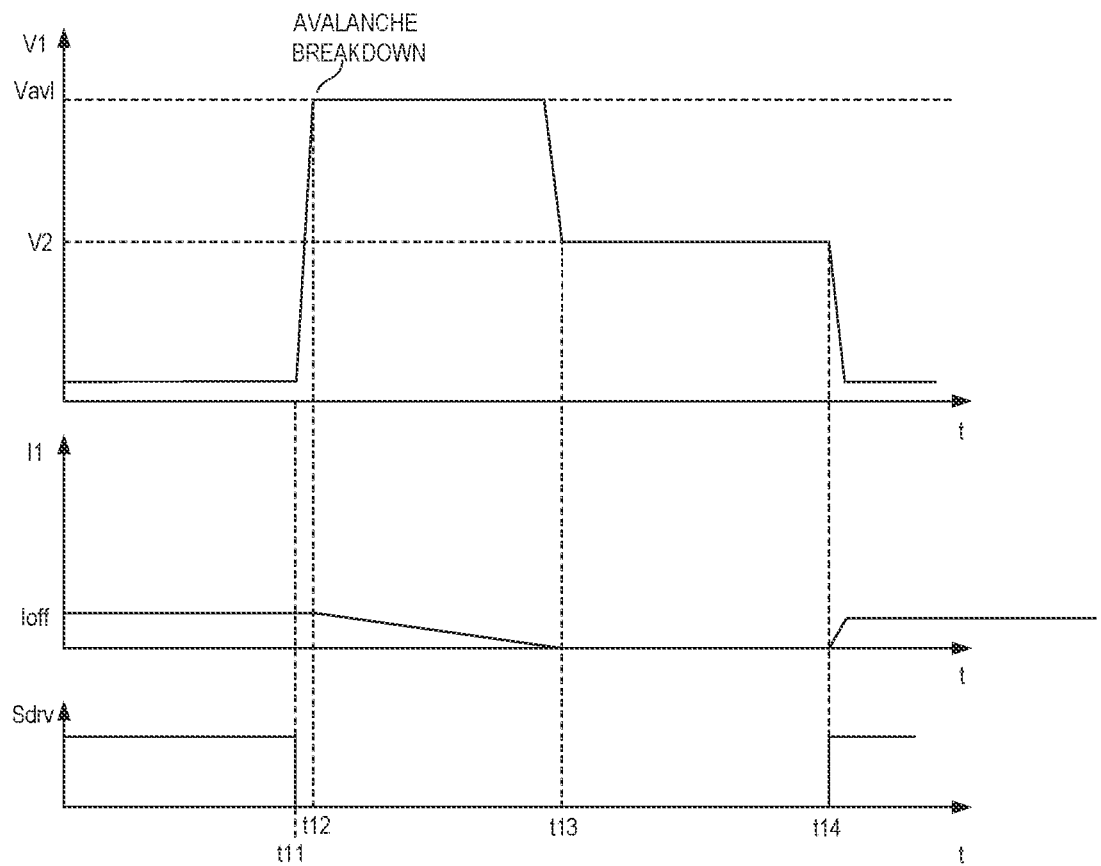
FIG. 2 shows signal diagrams that illustrate switching off the power transistor circuit, wherein switching off the power transistor circuit includes operating at least one power transistor included in the power transistor circuit in an Avalanche mode.

FIG. 2 shows signal diagrams of the drive signal Sdrv, the voltage V1 across the power transistor circuit 1, and the current I1 through the power transistor circuit 1 and into the load circuit 3 during a time period in which the power transistor circuit 1 changes from the on-state to the off-state. Referring to the above, the power transistor circuit 1 is in the on-state when the drive signal Sdrv has an on-level and in the off-state, when the drive signal Sdrv has an off-level. Just for the purpose of illustration, in the example shown in FIG. 2, the on-level of the drive signal Sdrv is represented by a high signal level and the off-level of the drive signal Sdrv is a represented by low signal level. In fact, the magnitude and sign of the drive signal Sdrv is dependent on the specific implementation of the power transistor circuit. This is explained in detail herein further below.

Referring to FIG. 2, before a first time instance t1, the power transistor circuit 1 is in the on-state. In this operating state, the voltage V1 across the power transistor circuit 1 is low as compared to the supply voltage V2 provided by the power source 2. In the on-state of the power transistor circuit 1, the voltage level of the voltage V1 across the power transistor circuit 1 is essentially given by the current level of the current I1 multiplied with an on-resistance of the power transistor circuit 1. The on-resistance of the power transistor circuit 1 is the electrical resistance of the power transistor circuit 1 between the first and second circuit nodes 11, 12 in the on-state. The on-resistance of the power transistor circuit 1 is dependent on the specific implementation of the power transistor circuit 1 and the type of transistor device(s) included in the power transistor circuit 1. According to one example, the on-resistance of the power transistor circuit 1 is in the range of between 1 milliohm (mΩ) and several 10 mΩ, for example.

Referring to FIG. 2, the drive signal Sdrv changes from the on-level to the off-level at the first time instance t11, so that the power transistor circuit 1 switches off and the electrical connection between the power source 2 and the load circuit 3 is interrupted. During the on-state of the power transistor circuit 1, energy is magnetically stored in the parasitic inductances. This energy causes the voltage V1 across the power transistor circuit 1 to increase after the first time instance t11, wherein the voltage V1 increases until the voltage V1 reaches an Avalanche breakdown level Vavl at a second time instance t12. The Avalanche breakdown level Vavl is a voltage level at which an Avalanche breakdown occurs in the at least one power transistor included in the power transistor circuit 1. The voltage V1 is clamped to the Avalanche breakdown level Vavl and essentially remains on this voltage level Vavl until the energy stored in the parasitic inductance 44 has been dissipated. After the energy has been dissipated, the current I1 through the power transistor circuit 1 reaches zero at a third time instance t13 and the voltage V1 across the power transistor circuit 1 decreases to the voltage level of the supply voltage V2 provided by the power source 2.

When the power transistor circuit 1 switches on for the next time, which is illustrated at a fourth time instance t14 in FIG. 2, the voltage V1 across the power transistor circuit 1 again decreases to a voltage level defined by the on-resistance of the power transistor circuit 1 and the current level of the current I1 through the power transistor circuit 1.

It should be noted that there may be a delay time between the first time instance t11, at which the drive signal Sdrv changes from the on-level to the off-level, and the time instance at which the power transistor circuit 1 switches off. Such delay time, however, is not illustrated in FIG. 2.

According to one example, the power transistor circuit 1 is operated at a low switching frequency, such as lower than 1 Hz, lower than $10^{-1}$ Hz, or even lower than $10^{-2}$ Hz. According to one example, operating the power transistor circuit 1 at a low switching frequency includes that a delay time between switching off the power transistor circuit 1 and again switching on the power transistor circuit 1 (for the first time after switching off), such as the delay time between time instances t11 and t14 in FIG. 2, is at least 1 second (s), at least 10 s, or at least 100 s.

According to one example, the power transistor circuit 1 is part of a battery main switch or forms a battery main switch. A "battery main switch" is an electronic switch between a battery and a load circuit in an automobile. A battery main switch is configured to conduct (without interruption) for a relatively long time period, such as, for example, as long as the automobile is in operation. This may last up to several hours.

According to another example, the power transistor circuit 1 is part of an electronic fuse (e-fuse) or forms an e-fuse. This is explained with reference to FIGS. 3 and 4 herein further below.

Energy that has been stored in the parasitic inductance 44 of the electronic circuit at the time of switching off the power transistor circuit 1 is dependent on the inductance of the parasitic inductor 44 and a current level of the current I1 at the time of switching off as follows, $$Ep = \frac{1}{2} \cdot Lp \cdot Ioff^2 \tag{1}$$

where Ep denotes the stored energy; Lp denotes the sum of the parasitic inductances (the inductance of inductor 44 representing these parasitic inductances); and Ioff denotes the current level of the load current I1 at the time of switching off the power transistor circuit 1.

The energy that can be dissipated by the at least one power transistor without being damaged or destroyed in the Avalanche mode is dependent on the specific type of power transistor and can usually be obtained from the data sheet of the power transistor. According to one example, the energy that can be dissipated in one Avalanche event is between 100 mJ (millijoules) and 400 mJ, in particular between 200 mJ and 400 mJ.

Figure 3:
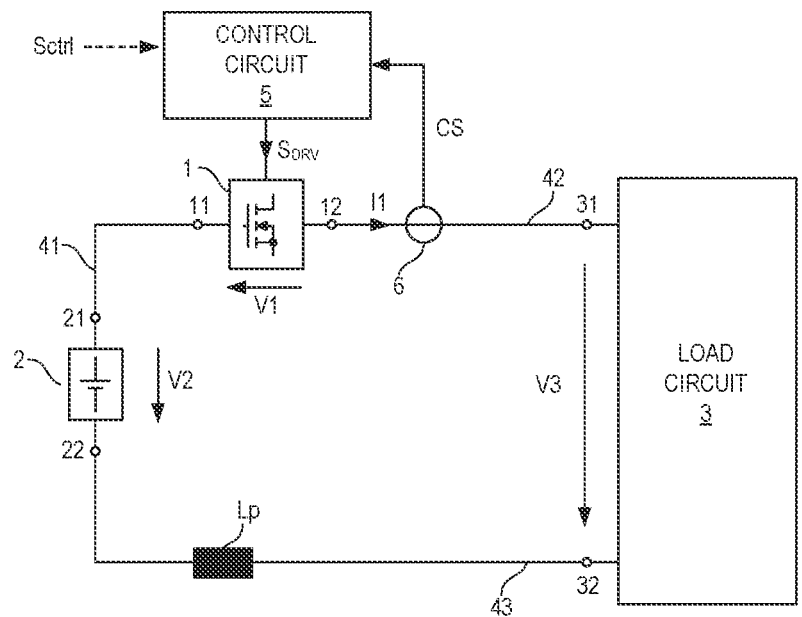
FIG. 3 illustrates an electronic circuit of the type shown in FIG. 1, which additionally includes a current sensor.

FIG. 3 shows a modification of the electronic circuit shown in FIG. 1. The electronic circuit according to FIG. 3 is based on the electronic circuit according to FIG. 1 and additionally includes a current sensor 6 which is configured to measure the current I1 through the power transistor circuit 1 and generate a current sense signal CS. The current sense signal CS represents a current level of the current I1 through the power transistor circuit 1. According to one example, a signal level of the current sense signal CS is proportional to the current level of the current H. Any kind of current sensor may be used to sense the current I1 and provide the current sense signal CS. Examples of the current sensor 6 include, but are not restricted to, an inductive current sensor, a Hall sensor, a shunt resistor, or the like.

The control circuit 5 receives the current sense signal CS. According to one example, the control circuit 5 is configured to switch off the power transistor circuit 1 upon detecting, based on the current sense signal CS, that the current I1 has reached an overcurrent level. According to one example, the overcurrent level Ioc is selected such that it is higher than current levels of the current I1 that may occur under normal operating conditions of the load circuit 3. The overcurrent level Ioc may occur under an overload condition. An overload condition may result from a short circuit in the load circuit 3, for example.

Figure 4:
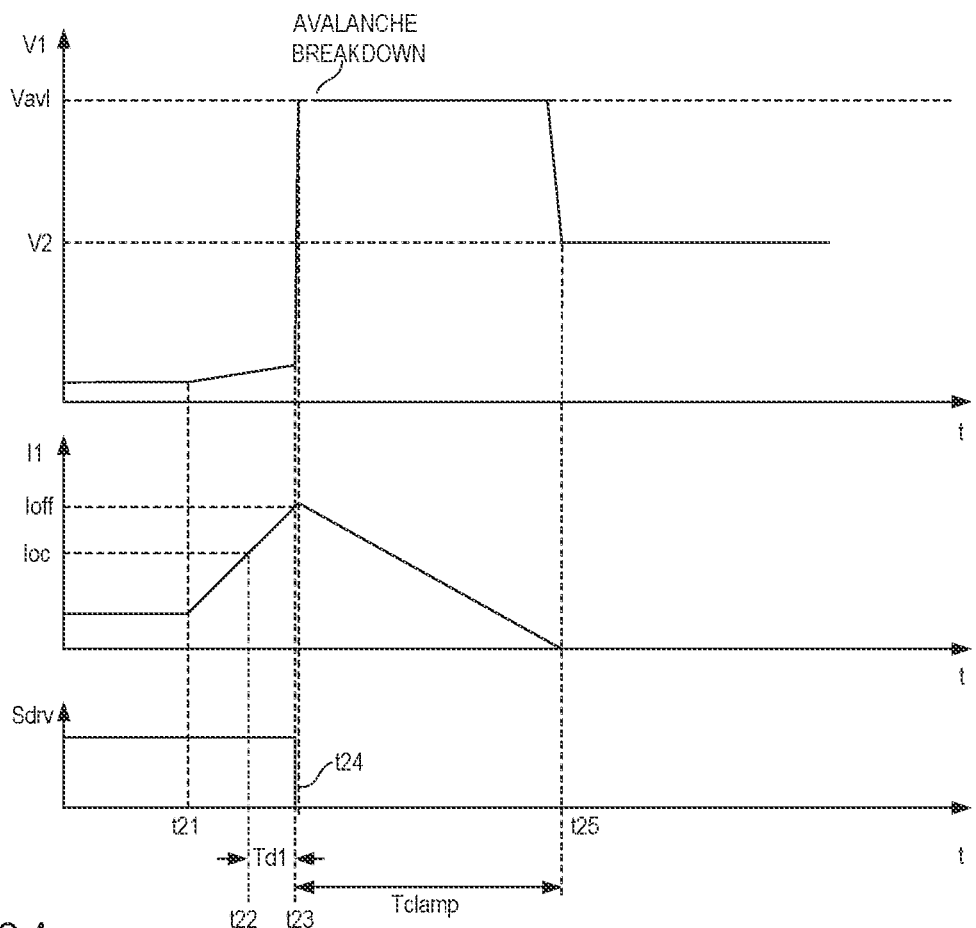
FIG. 4 shows signal diagrams that illustrate switching off the power transistor circuit in the electronic circuit according to FIG. 3 under overload conditions.

FIG. 4 shows signal diagram of the drive signal Sdrv, the voltage V1 across the power transistor circuit 1, and the current I1 through the power transistor circuit 1 during a time period in which an overload condition occurs. For the purpose of explanation, it is assumed that the power transistor circuit 1 is in the on-state and, at a first time instance t21, a fault occurs in the load circuit 3 that causes the load current I1 to increase. Such fault may include a short-circuit in the load circuit 3, for example.

Referring to FIG. 4, the fault in the load circuit 3 causes the load current I1 to increase after the first time instance t21, so that the load current I1 reaches the overcurrent level Ioc at a second time instance t22 and the power transistor circuit 1 switches off at a third time instance t23. After the third time instance t23 the voltage V1 across the power transistor circuit 1 rapidly increases due to the energy stored in the parasitic inductance 44 and reaches the Avalanche breakdown level Vavl at a fourth time instance t24.

Referring to FIG. 4, there is a delay time Td1 between the second time instance t21, at which the load current I1 reaches the overcurrent level Ioc, and the third time instance t22, at which the power transistor circuit 1 switches off. This delay time Td1 is due to inevitable delays that occur in connection with detecting that the load current I1 has reached the overcurrent level Ioc and switching off the power transistor circuit 1 upon detecting that the load current I1 has reached the overcurrent level Ioc. According to one example, the control circuit 5 and the power transistor circuit 1 are implemented such that the delay time Td1 is less than 500 nanoseconds (ns), less than 200 nanoseconds, or even less than 100 nanoseconds.

Referring to FIG. 4, after the fourth time instance t24 the voltage V1 across the power transistor circuit 1 is clamped to the Avalanche breakdown level Vavl. After the fourth time instance t23, the load current I1 decreases until it reaches zero at a fifth time instance t25, so that the voltage V1 across the power transistor circuit 1 decreases to the voltage level of the voltage V2 provided by the power source 2.

In the scenario illustrated in FIG. 4, the energy stored in the parasitic inductances and dissipated in the power transistor circuit 1 is also given by equation (1), wherein Ioff is the current level of the load current I1 at the third time instance t23 at which the power transistor circuit 1 switches off. Due to the delay time Td1 this current level Ioff is higher than the overcurrent level Ioc. If, for example, the fault in the load circuit 3 that causes the load current I1 to increase is a short-circuit in the load circuit, an increase of the load current is given by, $$\frac{dI1}{dt} = \frac{V2}{Lp}, \tag{2}$$

where V2 is the voltage level of the supply voltage V2 and Lp denotes the parasitic inductances. In this example, the current level Ioff of the load current I1 at the time of switching off is given by, $$Ioff = Ioc + \frac{V2}{Lp} \cdot Td1. \tag{3}$$

Thus, based on the parasitic inductance Lp and the delay time Td1, in consideration of the energy that can be dissipated in the at least one power transistor in the Avalanche mode, the overcurrent level Ioc can be suitably adjusted in the control circuit 5. According to one example, the current flowing through the power transistor circuit 1 in the Avalanche mode should not exceed a predefined threshold. In this example, selecting the overcurrent level Ioc further includes selecting the overcurrent level Ioc such that the predefined current threshold is not exceeded.

According to another example, the power transistor circuit 1 and the control circuit 5 operate as an e-fuse. In this example, the control circuit 5, in addition to or alternatively to comparing the current sense signal CS with a signal representing the overcurrent threshold, monitors the load current I1 (by monitoring the current sense signal CS over a certain time period) and switches off dependent on a time characteristic of the current I1. According to one example, the control circuit 5 switches off the power transistor circuit 1 in accordance with an $I^2t$ curve. This may include comparing the load current with different current threshold levels, wherein each current threshold level is associated with a different maximum time period, and wherein the power transistor circuit 1 is switched off whenever the load current I1 reaches a certain threshold and continues to flow for the maximum time period associated with the certain threshold.

In the following, switching off the power transistor circuit 1 by the control circuit 5 due to the load current I1 is referred to as current induced switching off in the following. According to one example, after a current induced switching off, the control circuit 5 is configured to again switch on the power transistor circuit 1 after a certain delay time after the power has been dissipated and the voltage V1 across the power transistor circuit 1 has reached the supply voltage level V2. According to another example, the control circuit 5 is configured to again switch on the power transistor circuit 1 only when a respective control signal $S_{CTRL}$ has been received by the control circuit 5.

According to one example, the control signal $S_{CTRL}$ is generated by an electronic circuit in response to a mechanical actuation of a button, a key, or the like, by a user.

In both the scenario shown in FIG. 2 and the scenario shown in FIG. 4, a duration Tclamp of a clamping period, which is the period in which power is dissipated in the power transistor circuit 1 is dependent on the Avalanche voltage level Vavl, the current level Ioff at the time of switching off, and the voltage level of the supply voltage V2 as follows, $$Tclamp = \frac{Lp \cdot Ioff}{Vavl - Vbat}. \quad (4)$$

Figure 5:
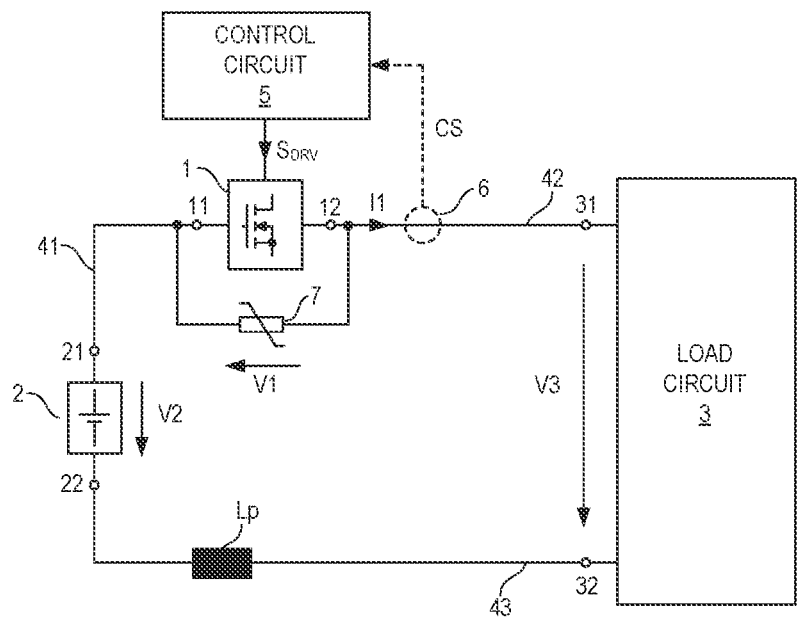
FIG. 5 shows an electronic circuit of the type shown in FIG. 3, which additionally includes a power dissipating element connected in parallel with the power transistor circuit.

FIG. 5 illustrates a further modification of the electronic circuit according to FIG. 1. The electronic circuit according to FIG. 5 is based on the electronic circuit according to FIG. 1 and additionally includes a power dissipating element 7 connected in parallel with the power transistor circuit 1. The current sensor 6 explained with reference to FIG. 3 is optional. That is, implementing the electronic circuit with the power dissipating element 7 in parallel with the power transistor circuit 1 is independent of using a current sensor 6 and implementing the control circuit 5 such that an overcurrent scenario can be detected.

According to one example, the power dissipating element 7 is an MOV (Metal Oxide Varistor). An MOV has a threshold voltage and is configured to conduct and dissipate power when the voltage across the MOV reaches the threshold voltage level. In the example shown in FIG. 5, the voltage across the MOV 7 is the same as the voltage V1 across the power transistor circuit 1.

An MOV, however, is relatively slow. That is, there is a significant delay time between a time instance at which the voltage across the MOV reaches the threshold voltage level and the time instance at which the MOV starts to conduct and clamps the voltage across the MOV to a voltage level given by the threshold voltage level. In particular, in applications in which an increasing voltage across the MOV is due to energy stored in parasitic inductances, the voltage across the MOV may increase to voltage levels that are significantly higher than the threshold voltage level before the MOV starts to conduct. The delay time of an MOV is between 100 ns (nanoseconds) and 500 ns, for example.

In the electronic circuit according to FIG. 5, the MOV 7 is selected such that its threshold voltage level is lower than the Avalanche breakdown voltage level of the power transistor circuit 1. This illustrated in FIG. 6 which shows signal diagrams of the drive signal Sdrv, the voltage V1 across the power transistor circuit 1 and the current I1 through the power transistor circuit 1 during a time period in which the power transistor circuit 1 is switched off.

Figure 6:
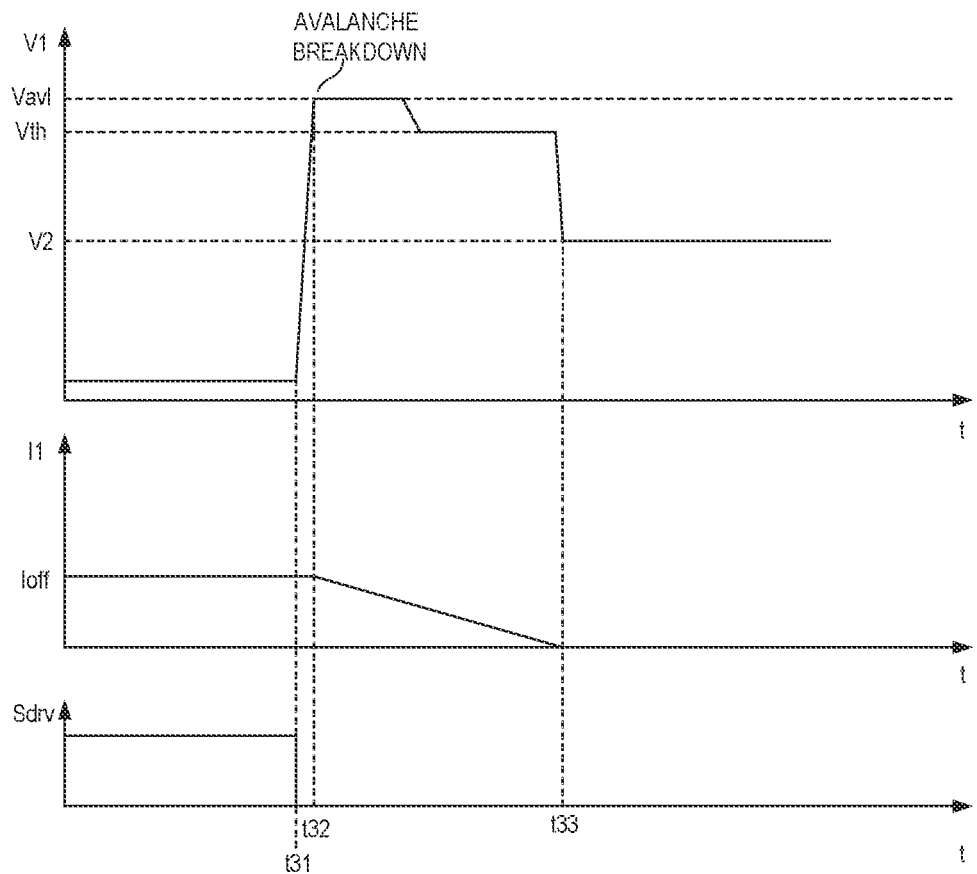
FIG. 6 shows signal diagrams that illustrate switching off the power transistor circuit in the electronic circuit according to FIG. 5 under overload conditions.

In FIG. 6, t31 denotes a first time instance at which the power transistor circuit 1 switches off, so that the voltage V1 increases until the voltage V1 reaches the Avalanche breakdown voltage level Vavl of the at least one power transistor included in the power transistor circuit 1. Referring to the above the threshold voltage level Vth of the MOV 7 is lower than the Avalanche breakdown voltage level Vavl. However, due to the slow switching behaviour of the MOV 7, the voltage V1 across the power transistor circuit and the MOV 7 rises above the threshold voltage level Vth and is clamped to the Avalanche breakdown voltage level Vavl by the power transistor circuit 1 until the MOV 7 switches on and clamps the voltage V1 to the threshold voltage level Vth. The voltage V1 across the power transistor circuit and the MOV 7 essentially remains on the threshold voltage level Vth until the energy has been dissipated and the load current I1 reaches zero at a third time instance t33.

According to one example, the power transistor circuit 1 and the MOV are adapted to one another such that the threshold voltage level Vth of the MOV is selected from between 80% and 95% the Avalanche breakdown voltage level of the power transistor circuit 1.

In the parallel circuit with the power transistor circuit 1 and the MOV 7, the power transistor circuit 1 ensures that the voltage V1 is clamped to the Avalanche breakdown voltage level Vavl and dissipates a portion of the energy previously stored in the parasitic inductance 44. When the MOV switches on, the voltage V1 across the power transistor circuit 1 falls below the Avalanche breakdown voltage level Vavl so that the power transistor circuit 1 no longer operates in the Avalanche mode and the remainder of the energy still stored in the parasitic inductances is dissipated in the MOV 7. The MOV 7 and the power transistor circuit 7 may be adapted to one another such that the MOV 7 has a higher capability to dissipate power than the power transistor circuit 1. According to one example, the MOV 7 is selected such that the energy that can be dissipated in the MOV 7 without being damaged is at least ten times the energy that can be dissipated in the power transistor circuit 1.

Referring to the above, the power transistor circuit 1 can be implemented in various ways. Different examples for implementing the power transistor circuit 1 are explained in the following.

Figure 7:
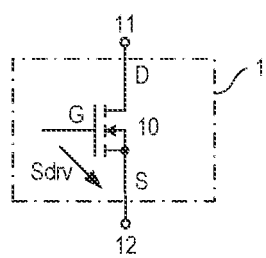
FIGS. 7 to 14 illustrate various examples of the power transistor circuit.

According to one example shown in FIG. 7, the power transistor circuit includes a single power transistor such as, for example, a single power MOSFET 10. The power MOSFET is a silicon (Si) based or a silicon carbide (SiC) based power MOSFET. "Si based" includes that active regions such as source, drift and drain regions of the power MOSFET are integrated in a monocrystalline silicon semiconductor body. "SiC based" includes that active regions of the power MOSFET are integrated in a SiC semiconductor body. The Avalanche breakdown voltage level of the power MOSFET 10 is dependent on the specific implementation. Si based MOSFETs are available with rated voltages of up to 800 V. SiC based power MOSFETs are available with rated voltages of up to 1.7 kV (1700 V). The "rated voltage" is the voltage the MOSFET can definitely withstand without being operated in the Avalanche mode. The Avalanche breakdown voltage level is usually between 5% and 10% higher than the rated voltage blocking capability.

According to one example, the power transistor is a superjunction transistor. The superjunction transistor is implemented as a silicon (Si) based or as a silicon carbide (SiC) based transistor, for example. Furthermore, the superjunction transistor is implemented as a MOSFET or a JFET, for example.

Referring to FIG. 7, the power MOSFET includes gate, drain and source nodes G, D, S and a drain-source path between the drain node D and the source node S. The MOSFET is a voltage controlled device that switches on or off dependent on a drive voltage (gate-source voltage) received between the gate node and the source node. According to one example, the drive voltage received by the MOSFET is the drive signal Sdrv provided by the control circuit 5 (not shown in FIG. 7).

The power MOSFET can be implemented as an n-type MOSFET or as a p-type MOSFET and can be implemented as an enhancement (normally-off) device or as a depletion (normally-on) device. Just for the purpose of illustration, the circuit symbol shown in FIG. 7 represents an n-type enhancement MOSFET.

A power MOSFET has a threshold voltage, which defines a voltage level of the drive voltage (gate-source voltage) at which the MOSFET changes between the on-level and the off-level. Whether the threshold voltage is a positive or a negative voltage level is dependent on type of MOSFET. In an n-type enhancement MOSFET, for example, the threshold voltage is a positive voltage. Furthermore, an n-type enhancement MOSFET is in the on-state when the drive voltage is higher than the threshold voltage and the off-state when the drive voltage is lower than the threshold voltage. In a p-type enhancement MOSFET, for example, the threshold voltage is a negative voltage. Furthermore, a p-type enhancement MOSFET is in the on-state when the drive voltage is lower than the negative threshold voltage and the off-state when the drive voltage is higher than the negative threshold voltage.

Referring to FIG. 7, the drain-source path of the power MOSFET, which may also be referred to as load path, is connected between the first and second nodes 11, 12 of the power transistor circuit 1. The load path conducts the load current I1 when the power MOSFET is in the on-state.

Figure 8:
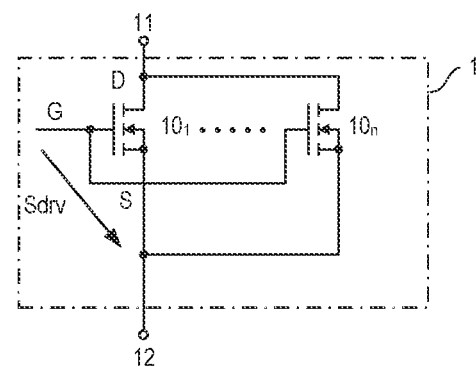

FIG. 8 shows a power transistor circuit 1 according to another example. In this example, the power transistor circuit 1 includes a plurality of power MOSFETs $10_1$, $10_n$ that are connected in parallel and each receive the drive signal as Sdrv between the respective gate node G and the respective source node S. "Connected in parallel" includes that the drain-source paths of the individual MOSFETs $10_1$, $10_n$ are connected in parallel between the first and second circuit nodes 11, 12 of the power transistor circuit 1. In the example shown in FIG. 8, the power transistor circuit 1 includes two power MOSFETs. This, however, is only an example. An arbitrary number of power MOSFETs can be connected in parallel.

The power MOSFETs $10_1$, $10_n$ connected in parallel have the same Avalanche breakdown voltage level so that each of the power MOSFETs $10_1$, $10_n$ operates in the Avalanche mode after switching off the power transistor circuit 1 and so that the power to be dissipated is shared by the several power MOSFETs.

Inevitably, the Avalanche breakdown voltage levels of the power may be (slightly) different. Thus, when the voltage across the load paths of the parallel MOSFETs $10_1$, $10_n$ increases one of the MOSFETs may start to operate in the Avalanche mode while one or more other MOSFETs in the parallel circuit may still operate in a blocking state. Nevertheless, the following effect protects the MOSFET that starts to operate in the Avalanche mode first from being damaged or destroyed. Dissipating power in a MOSFET that is operated in the Avalanche mode causes the temperature of the MOSFET to increase. Furthermore, the Avalanche breakdown voltage level is dependent on the temperature and increases as the temperature increases. Thus, the temperature of the MOSFET that is operated in the Avalanche mode first starts to increase, so that the level of the Avalanche breakdown voltage of this MOSFET increases, so that the voltage across the MOSFET parallel circuit increases and one or more of the other MOSFETs may start to operate in the Avalanche mode.

Figure 9:
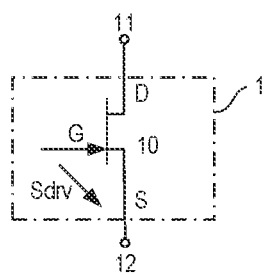

According to another example illustrated in FIG. 9, the power transistor circuit 1 includes a single power transistor 10 that is implemented as a JFET (Junction Field-Effect Transistor) and receives the drive signal as a drive voltage (gate-source voltage) between a gate node G and a source node S. The JFET can be implemented as an n-type device or as a p-type device. Just for the purpose of illustration, the circuit symbol shown in FIG. 9 represents an n-type JFET.

A JFET is a normally-on device, so that the JFET is in the on-state when the drive voltage (gate-source voltage) is zero. An n-type JFET has a negative threshold voltage and is in the off-state when the drive voltage is below the negative threshold voltage. A p-type JFET has a positive threshold voltage and is in the off-state when the drive voltage is above the positive threshold voltage.

Figure 10:
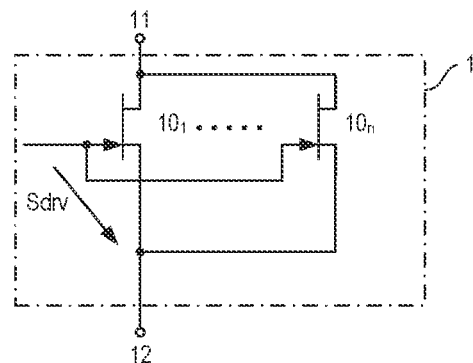

According to another example illustrated in FIG. 10, the power transistor circuit 1 includes several JFETs $10_1$, $10_n$ of the same type that are connected in parallel and that each receive the drive signal Sdrv as a drive voltage.

Figure 11:
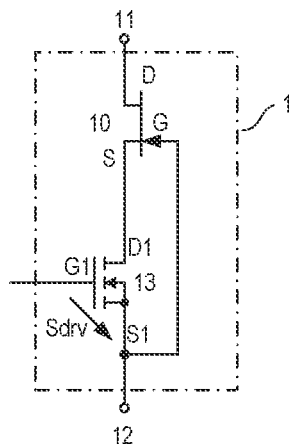

FIG. 11 illustrates a power transistor circuit according to another example. In this example, the power transistor circuit includes a power transistor 10 implemented as a normally-on transistor and a further transistor 13 implemented as a normally-off transistor. According to one example, the power transistor 10 is a JFET and the further transistor 13 is an enhancement MOSFET.

The normally-on transistor and the normally-off transistor are connected in series between the first and second nodes 11, 12 of the power transistor circuit 1. That is, in the example shown in FIG. 11, the drain-source path of the JFET 10 is connected in series with the drain-source path of an enhancement MOSFET 13, wherein the series circuit including the drain-source paths of the JFET 10 and the MOSFET 13 are connected between the first and second circuit nodes 11, 12 of the power transistor circuit 1.

The normally-on transistor 10 and the normally-off transistor 13 form a cascode circuit, wherein the normally-off transistor 13 receives the drive signal Sdrv as a drive voltage and governs the operating state of the normally-on transistor 10. The latter is achieved by connecting the normally-on transistor 10 and the normally-off transistor 13 with each other such that the drive voltage received by the normally-on transistor 10 equals the load-path voltage of the normally-off transistor 13. More specifically, in the example shown in FIG. 11, the operating state of the JFET 10 is governed by the MOSFET 13 that receives the drive signal Sdrv between its gate node G1 and its source node S1. The gate node of the JFET 10 is connected to the enhancement MOSFET 13 such that the gate-source voltage of the JFET 10 equals the drain-source voltage of the enhancement transistor 13. Just for the purpose of illustration, in the example shown in FIG. 9, the enhancement transistor 13 is an n-type enhancement transistor. In this example, the gate node G of the JFET 10 is connected to the source node S of the enhancement transistor 13 and the drain node D of the enhancement transistor 13 is connected to the source node S of the JFET 10.

The threshold voltage of the JFET 10 is negative so that the JFET 10 is in the on-state when its gate-source voltage is zero. Thus, the JFET 10 is in the on-state when the enhancement MOSFET 13 is switched on by the drive signal Sdrv. When the enhancement transistor 13 switches off, the drain-source voltage of the enhancement transistor 13 increases, so that the gate-source voltage of the JFET 10 turns negative and the JFET 10 switches off when its gate-source voltage falls below its threshold voltage level. The voltage blocking capability of the enhancement MOSFET 13 is higher than the magnitude of the threshold voltage of the JFET 10 and can be much smaller than the voltage blocking capability of the JFET 10. According to one example, the voltage blocking capability of the enhancement transistor 13 is selected from between 10 V and 50 V.

Referring to the above, the operating state of the normally-on transistor 10 is governed by the normally-off transistor 13, so that the cascode circuit, operated by the drive signal Sdrv, acts like a normally-off device. The power transistor that is configured to be operated in the Avalanche mode and dissipate the power is the normally-on transistor 10 in the cascode circuit.

Figure 12:
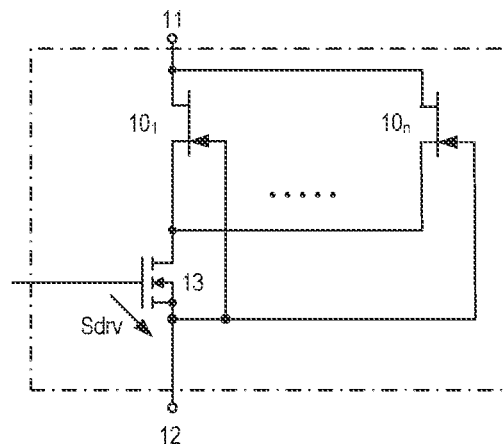

FIG. 12 shows a further modification of the power transistor circuit 1 according to FIG. 9. The power transistor circuit 1 according to FIG. 12 includes a plurality of normally-on transistors $10_1$, $10_n$ that have their load-paths connected in parallel. The low-voltage normally-off transistor 13 controls the drive voltage received by each of the normally-on transistors $10_1$, $10_n$. Just for the purpose of illustration, the normally-off transistor 13 is an enhancement MOSFET and the normally-on transistors $10_1$, $10_n$ are JFETs in the example shown in FIG. 12.

Figure 13:
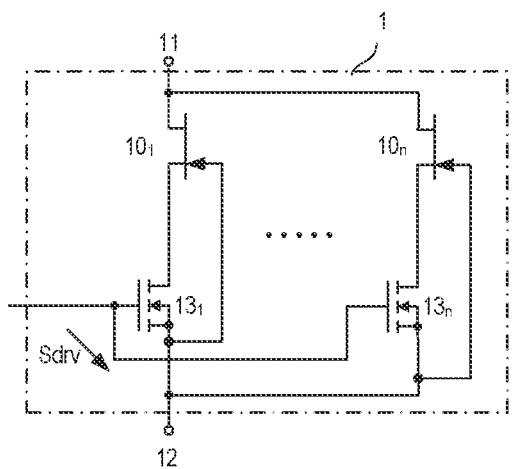

FIG. 13 shows a further modification of the power transistor circuit according to FIG. 11. The power transistor circuit according to FIG. 12 includes a plurality of cascode circuit of the type shown in FIG. 11 connected in parallel. Each of these cascode circuits includes a normally-on power transistor $10_1$, $10_n$ (a JFET in the example shown in FIG. 12) and a low-voltage normally-off transistor $13_1$, $13_n$ (an enhancement MOSFET in the example shown in FIG. 12) connected in series with the power transistor. The enhancement transistors $13_1$, $13_n$ each receive the same drive signal Sdrv.

In the examples illustrated in FIGS. 11 to 13, the at least one power transistor 10, $10_1$-$10_n$ is operated in the Avalanche mode when the voltage between the first and second circuit nodes 11, 12 of the power transistor circuit 1 increases in such a way that a voltage level of the voltage across the at least one power transistor 10, $10_1$-$10_n$ reaches the Avalanche breakdown voltage level of the at least one power transistor. According to an example, a voltage clamping element (not illustrated in FIGS. 11 to 13) is connected in parallel with the load path of the at least one (low-voltage) normally-off transistor 13. The voltage clamping element may include one or more Zener diodes or an MOV, for example. The voltage clamping element is configured to clamp the voltage across the load path of the at least one normally-off transistor 13, $13_1$-$13_n$ in such a way that a voltage level of this voltage remains below the Avalanche breakdown voltage level of the least one normally-off transistor 13, $13_1$-$13_n$, so that the at least one normally-off transistor 13, $13_1$-$13_n$ does not enter the Avalanche mode (while the at least one power transistor 10, $10_1$-$10_n$ operates in the Avalanche mode).

The power transistor circuit 1 according to each of the examples illustrated in FIGS. 7-8 and 11-13 is a unidirectionally blocking power transistor circuit. This includes that the power transistor circuit 1 is configured to block when the voltage between the first and second circuit nodes 11, 12 has a first polarity and conducts, independent of the drive signal Sdrv, when the voltage between the first and second circuit notes 11, 12 has a second polarity opposite the first polarity. The "second polarity" is a polarity that causes body diodes in the power transistors 10, $10_1$-$10_n$ according to FIGS. 7-8 or body diodes in the low-voltage normally-off transistors 13, $13_1$-$13_n$ to be forward biased, so that these transistors conduct independent of the respective drive signal Sdrv.

The power transistor second 1, however, is not restricted to be implemented as a unidirectionally blocking power transistor circuit but may also be implemented is a bidirectionally blocking power transistor circuit. A bidirectionally blocking power transistor circuit 1 is a power transistor circuit that is configured to block independent of a polarity of the voltage between the first and second circuit nodes 11, 12 (as long as the voltage is lower than the avalanche breakdown voltage level).

Figure 14:
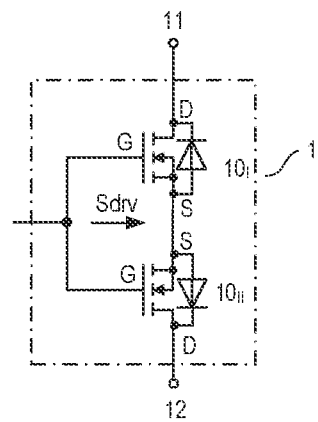

FIG. 14 illustrates one example of a bidirectionally blocking power transistor circuit 1. In this example, the power transistor circuit 1 includes two unidirectionally blocking normally-off transistors $10_I$, $10_{II}$ that are connected in series. Just for the purpose of illustration, each of the two normally-off transistors $10_I$, $10_{II}$ is an enhancement MOSFET. Each of these MOSFETs $10_I$, $10_{II}$ includes a body diode, which is represented by a respective diode symbol in the example shown in FIG. 14. The two MOSFETs $10_I$, $10_{II}$ are connected in series such that the body diodes are connected in anti-series. Referring to FIG. 14, this may include that the source nodes S of the two MOSFETs $10_I$, $10_{II}$ connected. According to one example, as illustrated in FIG. 14, each of the two MOSFETs $10_I$, $10_{II}$ receives the same drive signal Sdrv.

It should be noted that the power transistor circuit 1 according to FIG. 14 is not restricted to include only two normally-off transistors $10_I$, $10_{II}$. According to another example (not illustrated) the bidirectionally blocking power transistor circuit includes several first transistors that are connected in parallel and several second transistors that are connected in parallel, wherein a first parallel circuit including the first transistors is connected in series with a second parallel circuit including the second transistors in such a way that the body diodes in the first parallel circuit and the body diodes in the second parallel circuit are in an anti-series configuration.

Figure 15:
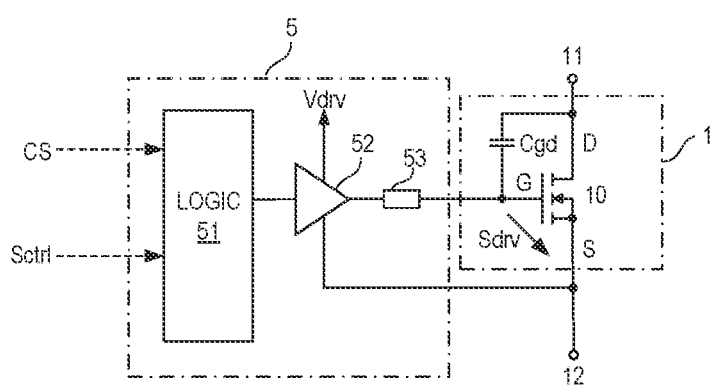
FIG. 15 illustrates one example of a control circuit configured to control the power transistor circuit.

FIG. 15 shows one example of the control circuit 5. In the example shown in FIG. 15, the control circuit 5 includes a logic circuit 51, a driver 52 and a gate resistor 53. The driver 52 is configured to generate the drive signal Sdrv based on a drive voltage Vdrv and dependent on a control signal S51 receive from the logic 51. The control signal S51 is a logic signal, for example, and indicates whether the power transistor circuit 1 is to be switched on or off. The driver 52 is configured to generate the drive signal Sdrv based on the control signal S51 such that the power transistor circuit 1 switches on when the control signal S51 indicates that the power transistor circuit 1 is to be switched on and that the power transistor circuit 1 switches off when the control signal S51 indicates that the power transistor circuit 1 is to be switched off.

The gate resistor 53 is due to inevitable line resistances between the driver 52 and the power transistor circuit 1. Just for the purpose of illustration, the power transistor circuit 1 is implemented with a single power MOSFET in the example shown in FIG. 15. In this case, the gate resistor 53 is due to line resistances between the driver 52 and the gate node G of the power MOSFET 10.

Inevitably, in a MOSFET, there is a capacitance between the gate node G and the drain node D, which is usually referred to as gate-drain capacitance. When the MOSFET is in the off-state and the drain-source voltage across the MOSFET rapidly increases, the capacitive coupling between the drain node D and the gate node G due to the gate-drain capacitance may cause the electrical potential at the gate node G to increase, so that the MOSFET erroneously switches on.

Figure 16:
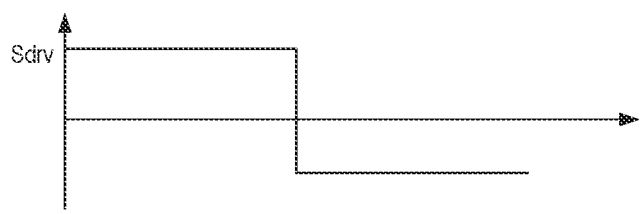
FIG. 16 illustrates a signal diagram of a drive signal generated by the control circuit according to one example.

According to one example, illustrated in FIG. 16, the drive signal Sdrv received by a power transistor circuit 1 that includes one or more n-type enhancement MOSFETs is generated such that the off-level of the drive signal is a negative voltage level, which may help to avoid that the power MOSFET erroneously switches on when the drain-source voltage rapidly increases in the Avalanche mode. According to one example, the off-level of the drive signal Sdrv is selected from between −2V and −8V, so that the magnitude of the off-level is between 2V and 8V.

Some of the aspects explained above are summarized in the following with reference to numbered examples.

Example 1. A method, including: switching off a power transistor circuit in an electronic circuit, wherein the electronic circuit includes a power source, a load circuit, and the power transistor circuit connected between the power source and the load circuit, and wherein switching off the power transistor circuit includes operating at least one power transistor included in the power transistor circuit in an Avalanche mode so that at least a portion of energy stored in the electronic circuit before switching off the power transistor circuit is dissipated in the at least one power transistor.

Example 2. The method of example 1, wherein the at least one power transistor includes exactly one power transistor.

Example 3. The method of example 1, wherein the at least one power transistor includes two or more power transistors.

Example 4. The method of any one of examples 1 to 3, wherein the at least one power transistor is a normally-off transistor.

Example 5. The method of example 4, wherein the normally-off transistor is a MOSFET.

Example 6. The method of any one of examples 1 to 3, wherein the at least one power transistor is a normally-on transistor.

Example 7. The method of example 6, wherein the normally-on transistor is a JFET.

Example 8. The method of any one of examples 1 to 7, wherein the at least one power transistor is a superjunction transistor.

Example 9. The method of any one of examples 1 to 8, wherein the at least one power transistor is one of a silicon based or a silicon carbide based power transistor.

Example 10. The method of any one of examples 1 to 9, wherein the power transistor circuit includes a first circuit node connected to the power source and a second circuit node connected to the load circuit, wherein the at least one power transistor includes a load path, and wherein the load path of the at least one power transistor is directly connected between the first and second circuit nodes.

Example 11. The method of any one of examples 1 to 9, wherein the power transistor circuit includes a first circuit node connected to the power source and a second circuit node connected to the load circuit, wherein the at least one power transistor is included in a cascode circuit, wherein the cascode circuit, in addition to the at least one power transistor, includes a further transistor, and wherein the cascode circuit is directly connected between the first and second circuit nodes.

Example 12. The method of any one of examples 1 to 11, wherein both the electronic circuit and the power transistor circuit are devoid of a clamping circuit configured to clamp the voltage across the at least one power transistor to a voltage level lower than an Avalanche breakdown voltage level of the at least one power transistor.

Example 13. The method of any one of examples 1 to 11, wherein the electronic circuit includes a clamping element connected in parallel with the power transistor circuit, wherein the clamping element is configured to conduct and clamp the voltage across the power transistor circuit to a voltage level that is lower than the Avalanche breakdown voltage level of the at least one power transistor after the at least one power transistor has been operating in the Avalanche mode.

Example 14. The method of any of examples 1 to 13, wherein the power source is configured to provide a direct voltage; wherein the at least one power transistor has an Avalanche breakdown voltage level and the at least one power transistor operates in the Avalanche mode when a voltage across a load path of the at least one power transistor reaches the Avalanche breakdown voltage level, and wherein the at least one power transistor is adapted to the direct voltage such that the Avalanche breakdown voltage level is between 120% and 150% of the voltage level of the direct voltage.

Example 15. The method of any one of examples 1 to 14, wherein switching off the power transistor circuit includes applying a drive voltage with an off-level between a gate node and a source node of the least one power transistor, and wherein a polarity of the off-level is opposite to a polarity of an on-level that is configured to switch on the least one power transistor.

Example 16. The method of example 15, wherein a magnitude of the off-level is between 2V and 8V.

Example 17. The method of any one of examples 1 to 16, wherein switching off the power transistor circuit includes applying, by a drive circuit a drive voltage with an off-level between a gate node and a source node of the least one power transistor, wherein a resistance between an output of the drive circuit and the gate node is less than 10 ohms.

Example 18. The method of any one of examples 1 to 17, wherein an overall inductance in the electronic circuit is less than 20 millihenries.

Example 19. The method of any one of examples 1 to 18, wherein a switching frequency of the power transistor circuit is less than 1 Hz.

Example 20. The method of any one of examples 1 to 19, wherein a time delay between switching off the power transistor circuit and again switching on the power transistor circuit is longer than 1 second.

What is claimed is:

1. A method, comprising:
   switching off a power transistor circuit in an electronic circuit,
   wherein the electronic circuit comprises a power source and a load circuit,
   wherein the power transistor circuit is connected between the power source and the load circuit,
   wherein switching off the power transistor circuit comprises operating at least one power transistor included in the power transistor circuit in an Avalanche mode so that at least a portion of energy stored in the electronic circuit before switching off the power transistor circuit is dissipated in the at least one power transistor, and
   wherein the power transistor circuit comprises a first circuit node directly connected to the power source and a second circuit node connected to the load circuit, wherein the at least one power transistor comprises a load path, and wherein the load path of the at least one power transistor is directly connected between the first and second circuit nodes.

2. The method of claim 1, wherein the at least one power transistor comprises exactly one power transistor.

3. The method of claim 1, wherein the at least one power transistor comprises two or more power transistors.

4. The method of claim 1, wherein the at least one power transistor is a normally-off transistor.

5. The method of claim 1, wherein the at least one power transistor is a normally-on transistor.

6. The method of claim 1, wherein the at least one power transistor is a superjunction transistor.

7. The method of claim 1, wherein the power transistor circuit comprises a first circuit node connected to the power source and a second circuit node connected to the load circuit, wherein the at least one power transistor is included in a cascode circuit, wherein the cascode circuit, in addition to the at least one power transistor, comprises a further transistor, and wherein the cascode circuit is directly connected between the first and second circuit nodes.

8. The method of claim 1, wherein both the electronic circuit and the power transistor circuit are devoid of a clamping circuit configured to clamp a voltage across the at least one power transistor to a voltage level lower than an Avalanche breakdown voltage level of the at least one power transistor.

9. The method of claim 1, wherein the electronic circuit includes a clamping element connected in parallel with the power transistor circuit, wherein the clamping element is configured to conduct and clamp a voltage across the power transistor circuit to a voltage level that is lower than the Avalanche breakdown voltage level of the at least one power transistor after the at least one power transistor has been operating in the Avalanche mode.

10. The method of claim 1, wherein the power source is configured to provide a direct voltage, wherein the at least one power transistor has an Avalanche breakdown voltage level and the at least one power transistor operates in the Avalanche mode when a voltage across a load path of the at least one power transistor reaches the Avalanche breakdown voltage level, and wherein the at least one power transistor is adapted to the direct voltage such that the Avalanche breakdown voltage level is between 120% and 150% of the voltage level of the direct voltage.

11. The method of claim 1, wherein switching off the power transistor circuit comprises applying a drive voltage with an off-level between a gate node and a source node of the least one power transistor, and wherein a polarity of the off-level is opposite to a polarity of an on-level that is configured to switch on the least one power transistor.

12. The method of claim 1, wherein switching off the power transistor circuit comprises applying, by a drive circuit, a drive voltage with an off-level between a gate node and a source node of the least one power transistor, and wherein a resistance between an output of the drive circuit and the gate node is less than 10 ohms.

13. The method of claim 1, wherein a switching frequency of the power transistor circuit is less than 1 Hz.

14. The method of claim 1, wherein a time delay between switching off the power transistor circuit and again switching on the power transistor circuit is longer than 1 second.

15. A method, comprising:
    switching off a power transistor circuit in an electronic circuit,
    wherein the electronic circuit comprises a power source and a load circuit,
    wherein the power transistor circuit is connected between the power source and the load circuit,
      wherein switching off the power transistor circuit comprises operating at least one power transistor included in the power transistor circuit in an Avalanche mode so that at least a portion of energy stored in the electronic circuit before switching off the power transistor circuit is dissipated in the at least one power transistor, and
      wherein the power transistor circuit comprises a first circuit node connected to the power source and a second circuit node connected to the load circuit, wherein the at least one power transistor is included in a cascode circuit, wherein the cascode circuit, in addition to the at least one power transistor, comprises a further transistor, and wherein the cascode circuit is directly connected between the first and second circuit nodes.

16. A method, comprising:
    switching off a power transistor circuit in an electronic circuit,
    wherein the electronic circuit comprises a power source and a load circuit,
    wherein the power transistor circuit is connected between the power source and the load circuit,
      wherein switching off the power transistor circuit comprises operating at least one power transistor included in the power transistor circuit in an Avalanche mode so that at least a portion of energy stored in the electronic circuit before switching off the power transistor circuit is dissipated in the at least one power transistor, and
      wherein the electronic circuit includes a clamping element connected in parallel with the power transistor circuit, wherein the clamping element is configured to conduct and clamp a voltage across the power transistor circuit to a voltage level that is lower than the Avalanche breakdown voltage level of the at least one power transistor after the at least one power transistor has been operating in the Avalanche mode.

17. A method, comprising:
switching off a power transistor circuit in an electronic circuit,
wherein the electronic circuit comprises a power source and a load circuit,
wherein the power transistor circuit is connected between the power source and the load circuit,
    wherein switching off the power transistor circuit comprises operating at least one power transistor included in the power transistor circuit in an Avalanche mode so that at least a portion of energy stored in the electronic circuit before switching off the power transistor circuit is dissipated in the at least one power transistor, and
    wherein the power source is configured to provide a direct voltage, wherein the at least one power transistor has an Avalanche breakdown voltage level and the at least one power transistor operates in the Avalanche mode when a voltage across a load path of the at least one power transistor reaches the Avalanche breakdown voltage level, and wherein the at least one power transistor is adapted to the direct voltage such that the Avalanche breakdown voltage level is between 120% and 150% of the voltage level of the direct voltage.

18. A method, comprising:
switching off a power transistor circuit in an electronic circuit,
wherein the electronic circuit comprises a power source and a load circuit,
wherein the power transistor circuit is connected between the power source and the load circuit,
    wherein switching off the power transistor circuit comprises operating at least one power transistor included in the power transistor circuit in an Avalanche mode so that at least a portion of energy stored in the electronic circuit before switching off the power transistor circuit is dissipated in the at least one power transistor, and
    wherein the method further comprises one or more of the following features:
applying, by a drive circuit, a drive voltage with an off-level between a gate node and a source node of the least one power transistor for switching off the power transistor circuit, and wherein a resistance between an output of the drive circuit and the gate node is less than 10 ohms;
wherein a switching frequency of the power transistor circuit is less than 1 Hz; and
wherein a time delay between switching off the power transistor circuit and again switching on the power transistor circuit is longer than 1 second.

* * * * *